(12) United States Patent
Frederick, Jr. et al.

(10) Patent No.: US 7,616,041 B2
(45) Date of Patent: Nov. 10, 2009

(54) DATA RETENTION IN OPERATIONAL AND SLEEP MODES

(75) Inventors: Marlin Frederick, Jr., Cedar Park, TX (US); James David Shiffer, III, Pleasanton, CA (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 12/232,570

(22) Filed: Sep. 19, 2008

(65) Prior Publication Data

US 2009/0033394 A1   Feb. 5, 2009

Related U.S. Application Data (60) Division of application No. 11/415,436, filed on May 2, 2006, now Pat. No. 7,514,975, which is a continuation-in-part of application No. 11/249,135, filed on Oct. 13, 2005, now abandoned.

(51) Int. Cl.
*H03K 3/289* (2006.01)
(52) U.S. Cl. .............................. 327/202; 327/544
(58) Field of Classification Search ............... 327/202, 327/211, 212, 544
See application file for complete search history.

(56) References Cited

U.S. PATENT DOCUMENTS 7,170,327 B2 *   1/2007   Aksamit ............... 327/202
7,183,825 B2 *   2/2007   Padhye et al. ........ 327/202
7,248,090 B2 *   7/2007   Ramprasad ........... 327/202
7,514,975 B2 *   4/2009   Frederick et al. ..... 327/202

* cited by examiner

Primary Examiner—Kenneth B. Wells
(74) Attorney, Agent, or Firm—Nixon & Vanderhye P.C.

(57) ABSTRACT

A circuit is disclosed for retaining a signal value during a sleep mode while a portion of said circuit is powered down comprising: a clock signal input operable to receive a clock signal; at least one latch clocked by said clock signal; a data input, a data output and a forward data path therebetween, wherein a signal value is operable to be received at said data input, is clocked through said at least one latch and passes to said data output along said forward data path; at least one of said at least one latch comprises a retention latch operable to retain a signal value during said sleep mode, said retention latch not being located on said forward data path; and a tristateable device, said tristateable device being arranged between said forward data path and said retention latch and being operable to selectively isolate said retention latch from said forward data path in response to receipt of a first sleep signal; wherein in response to receipt of a second sleep signal, said second sleep signal being received after said first sleep signal, said circuit is operable to enter said sleep mode such that a voltage difference across said portion of said circuit is reduced such that said portion of said circuit is powered down, and a voltage difference across said retention latch and said tristateable device is maintained.

26 Claims, 11 Drawing Sheets

Master Slave Retention Flop
(clock always active form)

Fig. 1 (Prior Art)

Master Slave Retention Flop
(clock always active form)

Master Slave Retention Flop Wave Forms
(clock always active form)

Master Slave Retention Flop
(clock goes inactive form)

Master Slave Retention Flop Wave Forms
(clock goes inactive form)

Fig. 5

Reset Master Slave Flop
(tapered NOR)

Fig. 6 (Prior Art)

Reset Master Slave Retention Flop
(clock goes inactive form)

Fig. 14 Reset Master Slave Retention Flop (clock goes inactive form)

DATA RETENTION IN OPERATIONAL AND SLEEP MODES

CROSS-REFERENCE TO RELATED APPLICATION

This application is a division of U.S. patent application Ser. No. 11/415,436, filed 2 May 2006, now U.S. Pat. No. 7,514,975, which is a continuation-in-part of commonly-owned U.S. patent application Ser. No. 11/249,135, filed 13 Oct. 2005, now abandoned. The entire content of these applications is incorporated herein by reference.

BACKGROUND OF THE INVENTION

1. Field of the Invention

This invention relates to the field of data processing systems. More particularly, this invention relates to circuits and methods of operating circuits that allow for the storage of a signal value in both operational and sleep modes.

2. Description of the Prior Art

In many circuits, particularly those that run off remote power supplies such as batteries, it is important to keep the power consumption of the circuits low. As well as addressing the issue of operational circuit efficiency attention is also being turned to reducing static power consumption, i.e. power loss due to leakage currents. One way of addressing this is to provide the circuit with a sleep mode so that it is in effect powered down during these non-operational periods. To reduce static power during these sleep periods, many circuit designs are now making use of on-chip power gating which allows rapid transitions between sleep and functional modes. This power gating is achieved by inserting power transistors between the targeted circuitry and Vdd creating a "virtual" Vdd rail, or by inserting power transistors between the targeted circuitry and Vss creating a "virtual" Vss rail. To enter a low leakage mode, the power transistors are turned off and the leakage of the design is limited by the leakage of the power transistors. Since the power transistors can be made to be high Vt (threshold voltage), and since the width of the power transistors can be much less than the width of the active devices in the circuit, leakage currents can be dramatically reduced. Thus, when the power transistors are turned off the virtual power rail at their output floats and the circuit is powered down.

Although this results in substantial power savings it also results in a loss of state within the targeted circuitry. If it is desired that the circuit retain state during sleep mode, data retention circuits such as special data retention flip-flops must be used within the design. Such a mode of operation allows the stored signal values to be securely held in a small portion of the circuitry whilst the remainder of the circuitry is powered down for leakage reduction purposes. When power is resumed, the saved signal value is restored and operation continues.

A common prior art approach to data retention is to provide an additional third storage or balloon latch that is not in the data pathway of the other two latches of a flip flop and to store data in this third latch during sleep mode. This latch has its own power supply and can be built of high threshold components. Such a system is described in "A 1-V High Speed MTCMOS Circuit Scheme for Power-Down Application Circuits" IEEE Journal of Solid-State Circuits, Vol 32, No 6, June 1997. A disadvantage of this approach is that the balloon latches consume considerable additional circuit area.

It has also been proposed for sense amplifier flip-flops and hybrid latch flip-flops which have associated scan cells that operate in accordance with the level sensitive scan design methodology to reuse the scan cells for data retention during a power down mode of operation. Whilst this approach reduces the increase in circuit overhead associated with providing the data retention capability, it does require control of the three clock signals of the sense amplifier flip-flops or hybrid latch flip-flops with their known disadvantages in terms of speed, power consumption and other factors. It is also only applicable to flip flops having dedicated scan latches.

"Lower Power Integrated Scan-Retention Mechanism" ISPLED August 2002, also addresses this problem.

Co pending U.S. application Ser. No. 11/088,268 having the same assignee as this patent also addresses this problem.

SUMMARY OF THE INVENTION

A first aspect of the present invention provides a circuit for retaining a signal value during a sleep mode while a portion of said circuit is powered down comprising: a clock signal input operable to receive a clock signal; at least one latch clocked by said clock signal; a data input, a data output and a forward data path therebetween, wherein a signal value is operable to be received at said data input, is clocked into said at least one latch and passes to said data output along said forward data path; wherein at least one of said at least one latch comprises a retention latch operable to retain a signal value during said sleep mode; and said circuit further comprises a tristateable device, said tristateable device being arranged between said forward data path and said retention latch and being operable to selectively isolate said retention latch from said forward data path in response to receipt of a first sleep signal; wherein in response to receipt of a second sleep signal, said second sleep signal being received after said first sleep signal, said circuit is operable to enter said sleep mode such that a voltage difference across said portion of said circuit is reduced such that said portion of said circuit is powered down, and a voltage difference across said retention latch and said tristateable device is maintained.

The arrangement of the present invention that provides a data retention device that can retain data in sleep mode and is not itself on the forward data path, is an effective way of retaining data without slowing the critical timing path, which comprises the forward data path. Furthermore, the use of a tristateable device placed between the forward data path and the retention latch which can selectively isolate the retention latch, is a convenient way of retaining data in sleep mode and again does not effect the critical timing path. Removing these devices from the critical timing path allows the designer greater freedom in his selection of components for these devices and therefore allows for the selection of, for example, low leakage components that may not have such high performance.

Although it is possible for there to be only one latch, in most embodiments the circuit comprises a plurality of latches clocked by said clock signal, said signal value passing from one of said plurality of latches to a subsequent one of said plurality of latches along said forward data path, at least one of said plurality of latches comprising said retention latch.

In some embodiments, said tristateable device comprises a bidirectional tristateable device.

Although it is not necessary in all embodiments for the tristateable device to be bidirectional, in some embodiments it is advantageous for this to be so as it can for example allow for the restoration of the state of a latch through the device, where a unidirectional device may not allow this.

In some embodiments, said bidirectional tristateable device comprises two transistors operable to receive said first sleep signal and arranged such that in response to receipt of said first sleep signal said two transistors form a high impedance path and in response to not receiving said first sleep signal said two transistors form a low impedance path.

In other embodiments, said tristateable device comprises four transistors, two of said four transistors forming said tristateable device and two of said four transistors forming an inverter operable to invert said first sleep signal prior to inputting it to one of said two transistors.

Depending on whether an inverted sleep signal is available within the circuit, the bidirectional tristateable device may be provided by two or four transistors. In either case the provision of just a few transistors is sufficient to adapt a traditional latch into a retention latch in some embodiments. Thus, a retention latch is achieved with a small increase in circuit area.

Although any sort of tristateable device may be used, in some embodiments the tristateable device comprises a transmission gate. Any tristateable devices that provide a low impedance in response to one input and a high impedance in response to another would be appropriate, but a transmission gate is found to be particularly effective.

In some embodiments, said data retention latch does not receive said clock signal while in others said data retention latch is operable to receive said clock signal.

Although it is possible to provide a latch circuit that is not clocked, it is found that one that is clocked can switch between states more easily and thus, may be preferred in some embodiments.

In some embodiments, said circuit further comprises clock signal distribution means operable to distribute said clock signal to said retention latch.

Although the clock signal may be generated outside of the circuit in others it is generated within the circuit. Distributing the clock to the retention latch enables a clocked retention latch to switch state.

Although provision of the clocked signal to the retention latch enables it to switch state more easily, it does have a drawback in that power needs to be supplied to the clock distribution in sleep mode and this can add significantly to static power loss.

In some embodiments, said clock signal distribution means comprises a first sleep signal input operable to receive a first sleep signal; wherein in response to said first sleep signal said clock signal distribution means is operable to hold said clock signal at a predetermined value such that said retention latch retains state.

Providing a clock signal at a predetermined value ensures the latch is in its data retaining recirculating mode.

Although the clock distribution means may comprise a number of forms, in some embodiments, said clock signal distribution means comprises a logic gate having a clock signal input and a first sleep signal input.

Such an arrangement is simple and yet allows the clock signal as seen by the latches to be held at a predetermined value in response to the sleep signal.

In some embodiments said clock signal distribution means comprises a plurality of components through which a clock signal propagates, said circuit is operable to reduce a voltage difference across said components of said clock signal distribution means upstream in a clock signal propagation direction of said first sleep signal input such that said components are powered down in response to said first sleep signal, and to maintain a voltage difference across said components downstream of said first sleep signal input.

Power needs to be supplied to some of the clock distribution devices in order to ensure that the signal value is held at said predetermined value. The above arrangement allows much of the clock distribution devices to be powered down, while ensuring the clock signal is kept at the desired value.

In some embodiments, said retention latch comprises a clocked tristate inverter, and transistors arranged in parallel with a portion of said clocked tristate inverter and operable to receive said first sleep signal such that said retention latch is operable to retain state irrespective of a value of said clock during receipt of said first sleep signal.

One disadvantage with some embodiments of the present invention is that the clock signal to the retention latch needs to be maintained in order for the latch to remain in a recirculating mode. The clock distribution logic which distributes the clock signal to the different components comprises components that are often not low leakage components and which thus can use a lot of power. Thus, it is a considerable disadvantage to static power loss if power needs to be maintained to this part of the circuit during sleep mode. The provision of additional components which allow the clocked tristate inverter to retain state irrespective of the clock signal can therefore be very advantageous, as it allows the clock signal distribution logic to be powered down during sleep mode and therefore avoids or at least reduces power loss due to this part of the circuit.

In some embodiments, said transistors comprise two transistors in parallel with said two clocked transistors of said tristate inverter, said two transistors receiving said first sleep signal and an inverted first sleep signal respectively.

The advantages of reduced power loss due to enabling the clock circuit to be powered down in sleep mode can be achieved with just two additional transistors. Thus, a small increase in circuit area can lead to the advantages of a relatively high reduction in static power consumption.

In some embodiments, said circuit comprises at least one further latch, at least two of said latches comprising a master slave flip flop comprising a master latch and a slave latch, said retention latch comprising said slave latch.

Although the retention latch can comprise any latch, for example a glitching element, a latch within a master slave flip flop is found to be particularly advantageous. Furthermore, although the retention latch could be formed from the master latch of such a flip-flop, generally it is formed from the slave latch. It should be noted that whatever latch it is formed from it should be in "look aside" mode, i.e. it should not be located on the forward data path.

In some embodiments, said master slave flip flop comprises a reset master slave flip flop, said retention latch comprising two transistors operable to receive said first sleep signal and a reset signal and operable to block said reset signal and prevent it from resetting a state of said retention latch in response to receipt of said first sleep signal.

Although the retention latch may be formed within a reset flip flop, if it is there are additional potential problems that need to be addressed. The potential problems relate to the possibility of the reset signal being inadvertently activated on entering or leaving sleep mode such that the retention latch is reset and the data that it should retain is lost. Thus, in embodiments of the invention which utilise reset flops additional transistors may be used which block the reset signal from affecting the retention latch during sleep mode. Controlling the additional transistors with a first sleep signal which is activated before the second sleep signal ensures that the reset signal is held low while the portion of the circuit is powered down.

A similar problem may occur with set master slave flip flops and thus embodiments of the present invention provide a circuit wherein said master slave flip flop comprises a set master slave flip flop, said retention latch comprising two transistors operable to receive said first sleep signal and a set signal and operable to block said set signal and prevent it from setting a state of said retention latch in response to receipt of said first sleep signal.

Additional transistors can also be used to prevent these set signals from changing the data stored in the retention latch.

In some embodiments, the power supplied to the circuit is supplied from outside of the circuit, while in other embodiments the circuit comprises a voltage regulator operable to control a voltage level supplied to portions of said circuit, said voltage regulator being operable to receive said second sleep signal and in response to said second sleep signal to reduce a voltage difference across said portion of said circuit such that said portion of said circuit is powered down; and to maintain a voltage difference across said retention latch and said bidirectional tristateable device.

In some embodiments, said circuit is operable to be powered in response to a voltage difference applied across said circuit, said circuit further comprising a power transistor, said power transistor being arranged such that said voltage difference is applied across said power transistor and said portion of said circuit in series, said power transistor being operable to receive said second sleep signal and being operable to be turned off in response to said second sleep signal, such that a voltage difference across said portion of said circuit is reduced and said portion of said circuit is powered down in response to said second sleep signal.

Although the sleep state of the portion of the circuit that is powered down can be achieved in a number of ways, power transistors are simple and effective ways of achieving this sleep state which have very low static power loss.

In embodiments of the invention said retention latch and said tristateable device comprise low leakage devices.

As the retention latch and tristateable device are continually powered, it is highly advantageous to make them from low leakage components such as devices having a high threshold voltage. This means that there is very little static power loss from these components. Furthermore, as these components are arranged to be not on the forward data path i.e. not on the critical timing path the provision of low leakage components in this pathway does not affect the performance of the circuit.

In some embodiments, the circuit comprises a plurality of retention latches.

A plurality of retention latches for storing a plurality of signals in sleep mode can be provided within the circuit.

In some embodiments, said circuit further comprises a plurality of portions each comprising at least one retention latch.

A device can comprise a plurality of portions each having its own retention latch. These can be controlled by the same sleep signals or the circuit can be controlled by a plurality of different sleep signals such that different portions of the circuit can enter sleep mode and be powered down at different times.

In some embodiments said circuit further comprises an output device between said retention latch and said output, and a driving device in data communication with an input of said output device; wherein said output device and said driving device are operable to enter said sleep mode on receipt of said second sleep signal; and said driving device is operable to drive an input of said output device in response to said second sleep signal not being asserted and said first sleep signal being asserted.

It should be noted that in some embodiments there is an output device prior to the output which is used to decouple the output from the input and provide suitable driving characteristics. There can be a problem associated with this device, which is that when the second sleep signal is not asserted but the first sleep signal is, nothing is driving the device, but it is on. This can potentially lead to large current leakage through the device. Embodiments of the present invention address this problem by providing a driving device that sends a driving signal to the input of the output device when the second sleep signal is not asserted. This ensures that the output device is driven and is not leaking current.

In some embodiments, said retention latch comprises a circulating loop and said driving device is a tristate inverter having an input in data communication with a portion of said loop remote from an output of said circulating loop.

A tristate inverter arranged between the retention latch and the input of the output device is a simple yet effective driving device, which impedes the potential current leakage problems described above.

In some embodiments, said circuit further comprises clock signal distribution means operable to distribute said clock signal to said retention latch and said tristate inverter, said clock signal distribution means comprising a first sleep signal input operable to receive a first sleep signal and a second sleep signal input operable to receive a second sleep signal, said clock distribution means being operable to output a signal at a predetermined level in response to said first sleep signal being asserted and said second sleep signal not being asserted and to be powered down in response to said first sleep signal and said second sleep signal being asserted, and to output said clock signal in response to neither being asserted; wherein said tristate inverter is operable in response to said clock being at said predetermined level and said second sleep signal not being asserted to drive said output inverter.

It is advantageous in sleep mode for the clock distribution logic to be powered down as this saves power. However, when the second sleep signal is not asserted but the first sleep signal is asserted it is important that the clock, clocking the tristate inverter is held at a particular level in order for this inverter to be on and able to drive the input of the output device. Furthermore, holding the clock at a particular level also enables the state in the retention latch to be output without needing to wait for the first sleep signal not to be asserted.

In some embodiments said driving device comprises a tristateable device, said tristateable device, being oppositely clocked to said tristateable device arranged on said forward data path such that one of said tristateable devices is operable to drive said output device in response to a clock signal received by said tristateable devices having a predetermined level.

A tristateable device can be used as the driving device, provided this is oppositely clocked to the tristateable device on the forward data path, this can be used to ensure any output device is driven while the clock signal is at a predetermined level.

In some embodiments, said circuit comprising at least one further latch, at least two of said latches comprising a reset master slave flip flop, comprising a master latch a slave latch, and two reset inputs, each of said two reset inputs being in data communication with said retention latch via respective one of said two oppositely clocked tristateable devices, said retention latch comprising said slave latch, wherein said retention latch comprises a circulating loop and a tristateable device, said tristateable device being operable to isolate said circulating loop from said reset inputs in response to said first sleep signal being asserted.

The use of a tristateable device that isolates the circulating loop of the retention latch in response to a first sleep signal enables the state of the latch to be preserved during retention mode, even if there is a glitch on the reset signal A further aspect of the present invention provides a method of storing a signal value within a circuit during a sleep mode while a portion of said circuit is powered down, said method comprising the steps of: distributing said clock signal to a clock input of at least one latch, said at least one latch being located between a data input and a data output such that a signal value received at said data input, is clocked into said at least one latch and passes to said data output along a forward data path, and at least one of said at least one latch is a retention latch operable to retain a signal value during said sleep mode; wherein in response to a first sleep signal: isolating said retention latch from said forward data path using a tristateable device located between said forward data path and said retention latch; in response to a second sleep signal: reducing a voltage difference across said portion of said circuit such that said portion of said circuit is powered down; and maintaining a voltage difference across said retention latch and said tristateable device.

A yet further aspect of the present invention provides a circuit for retaining a signal value while a portion of said circuit is powered down comprising: a clock signal input operable to receive a clock signal; a means for retaining data clocked by said clock signal and comprising: a forward data path such that a signal value passes from a data input and is clocked into a retention means and passes to a data output along said forward data path; said retention means being operable to retain a signal value during a sleep mode; and a tristateable means for selectively isolating said retention means from said forward data path in response to receipt of a first sleep signal, said tristateable means being arranged between said forward data path and said retention means; wherein in response to receipt of a second sleep signal, said second sleep signal being received after said first sleep signal, said circuit is operable to enter said sleep mode such that a voltage difference across said portion of said circuit is reduced such that said portion of said circuit is powered down, and a voltage difference across said retention means and said tristateable means is maintained.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
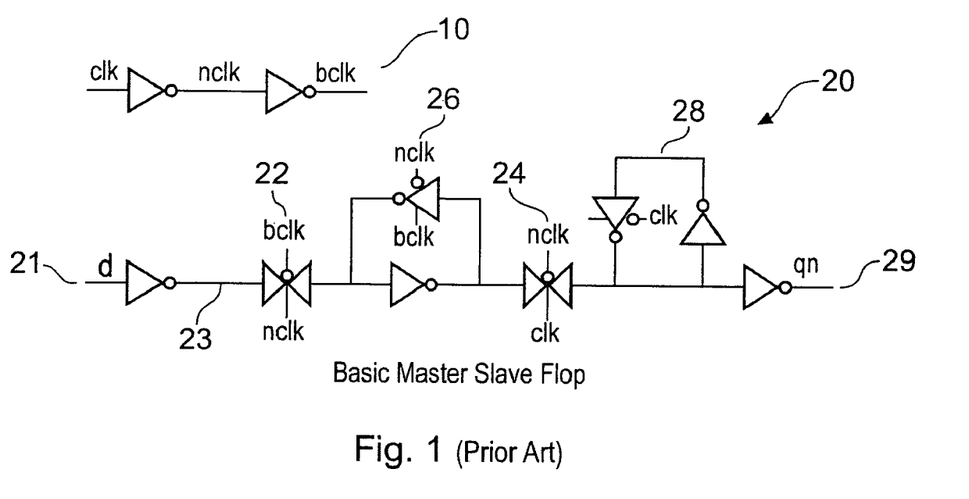
FIG. 1 schematically shows a master slave flip flop according to the prior art.

FIG. 1 shows in schematic form a basic master slave flip flop according to the prior art. This basic master slave flop 20 has a clock distribution means 10 which comprises a plurality of inverters operable to deliver different clock signals, clk, nclk an inverted form of clk, and bclk an inverted form of nclk. The basic master slave flop has a forward data path 23, between data input 21 and data output 29. This forward data path takes data from the input to a master latch 26 via transmission gate 22 and to slave latch 28 via transmission gate 24. Transmission gates 22 and 24 are tristateable devices able to provide a low impedance data path or a high impedance data path depending on the clock values at their inputs. Thus, they act to either isolate the latches or to allow transmission of data to them.

Figure 2:
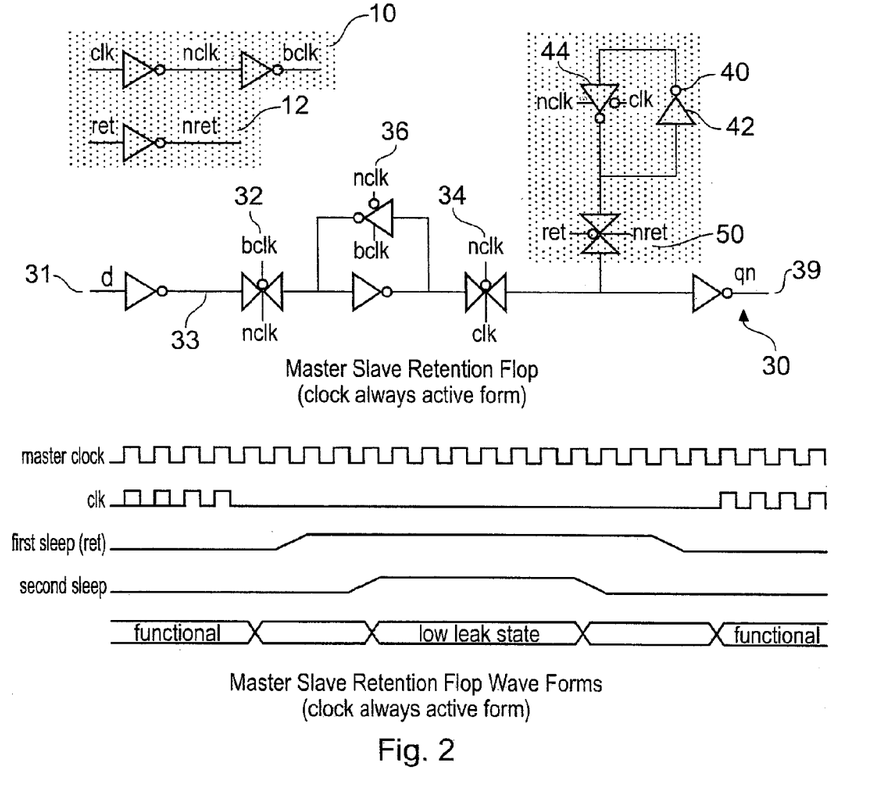
FIG. 2 schematically shows a master slave retention flip flop according to a first embodiment of the present invention and a timing diagram of its operation.

FIG. 2 shows a master slave retention flop 30 according to an embodiment of the present invention. This is an adaptation of the flop of FIG. 1 and is able to provide data retention within the slave latch during a "sleep mode" when a portion of the flop is powered down.

This embodiment comprises clock distribution logic 10 and additionally retention signal (ret) or first sleep signal distribution logic 12. These logic blocks are not powered down in sleep mode and this is indicated in the figure by the shading. Master slave retention flop 20 comprises a forward data path between data input 31 and data output 39. The forward data path 33 takes data from the input 31 to master latch 36 and then to slave latch 40. It comprises transmission gates 32 and 34 between the data input 31 and the master latch 36 and between the master 36 and slave latch 40 respectively. Slave latch 40 also acts in this embodiment as the data retention latch and is selectively isolated from forward data path 33 by a bidirectional tristateable device 50. The slave latch 40 and bidirectional tristateable device 50 are not powered down in sleep mode and this is indicated in the figure by the shading. In this case bidirectional tristateable device 50 is a transmission gate, although any bidirectional tristateable device operable to selectively provide high or low impedance and operable to drive a signal in either direction would be suitable. Unlike transmission gates 32 and 34 transmission gate 50 receives the retention and inverted retention signals from retention or sleep signal distribution logic 12 as its control signals. Transmission gate 50 is responsive to these signals to either offer a low impedance state such that the slave latch 40 is in data communication with the forward data path 33 when the retention signal is low, or in response to the retention signal going high to offer a high impedance state such that the slave latch 40 is isolated from the forward data path 33.

Slave latch 40 comprises an inverter 42 and a tristate inverter 44. The tristate inverter 44 is clocked by clock signals sent from clock signal distribution logic 10. It is for this reason that clock signal distribution logic must always be powered up in this embodiment to ensure that the recirculating path within the slave latch 40 is driven and remains closed.

FIG. 2 also shows a timing diagram giving the values of the master clock, clk signal, the first sleep signal which corresponds to the retention signal ret and the second sleep signal which provides an indication to portions of the circuit to power down. It also shows the states that these signals put the flop into, that is the functional, the low leakage and the intermediate states of this master slave retention flop.

Figure 3:
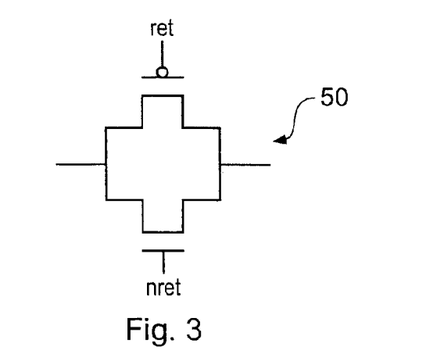
FIG. 3 shows the component transistors of transmission gate 50 of FIG. 2.

FIG. 3 shows transmission gate 50 of FIG. 2 in transistor form. This shows a preferred embodiment of the transmission gate. Clearly, any tristateable device that can selectively isolate the slave latch 40 from the forward data path 33 would be suitable. However, this preferred embodiment comprises just two transistors (four if the sleep signal, ret needs to be inverted and is not supplied to the circuit in inverted form) and thus, does not increase the circuit area of the flop by a large amount.

Figure 4:
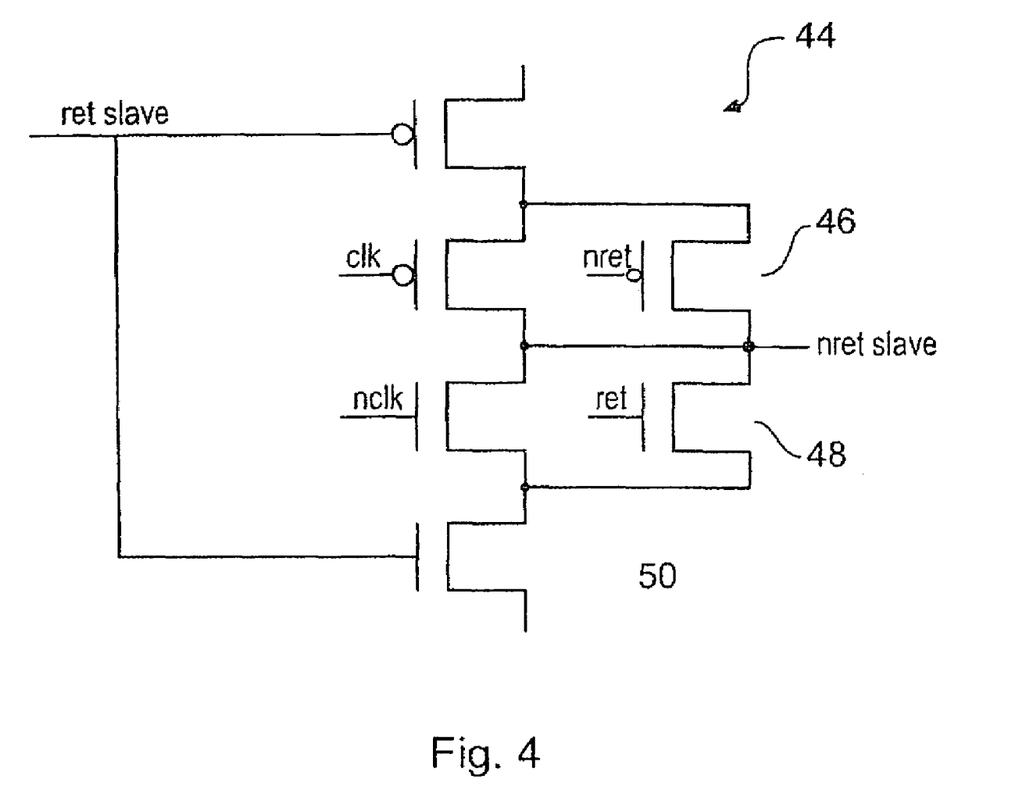
FIG. 4 shows the component transistors of an amended tristate inverter of the slave latch of a second embodiment of the present invention.

One drawback of the embodiment of FIG. 2 is that the clock distribution logic 10 needs to retain power in order for the slave or retention latch 40 not to lose state. FIG. 4 shows a second embodiment giving an alternative arrangement for the tristate inverter 44 of FIG. 2. In this alternative arrangement, an additional two transistors 46 and 48 have been added in parallel to the clocked transistors of the tristate inverter 44. These two transistors receive the retention signal and the inverted retention signal from retention signal logic 12. By placing these two transistors in this position, the retention of the data within slave latch 40 can be assured provided the retention signal is high whatever the values of the clock signals. Thus, data can be retained even if clock signal distribution logic is turned off. This ability to turn the clock signal distribution logic off can provide a large saving in power to the circuit as clock distribution signal logic is generally not made of high Vt (threshold voltage) devices and is quite large thereby consuming a relatively large amount of static power.

An alternative to this (not shown) would be to hold the clock signal of tristate inverter 44 using logic and the sleep signal ret, thereby ensuring that the circulating loop of the retention latch stays open and data is retained without the need to run the clock signal continuously. A disadvantage of this is that at least some of the clock signal distribution logic would need to be powered so there is more power loss than the embodiment of FIG. 4.

Figure 5:
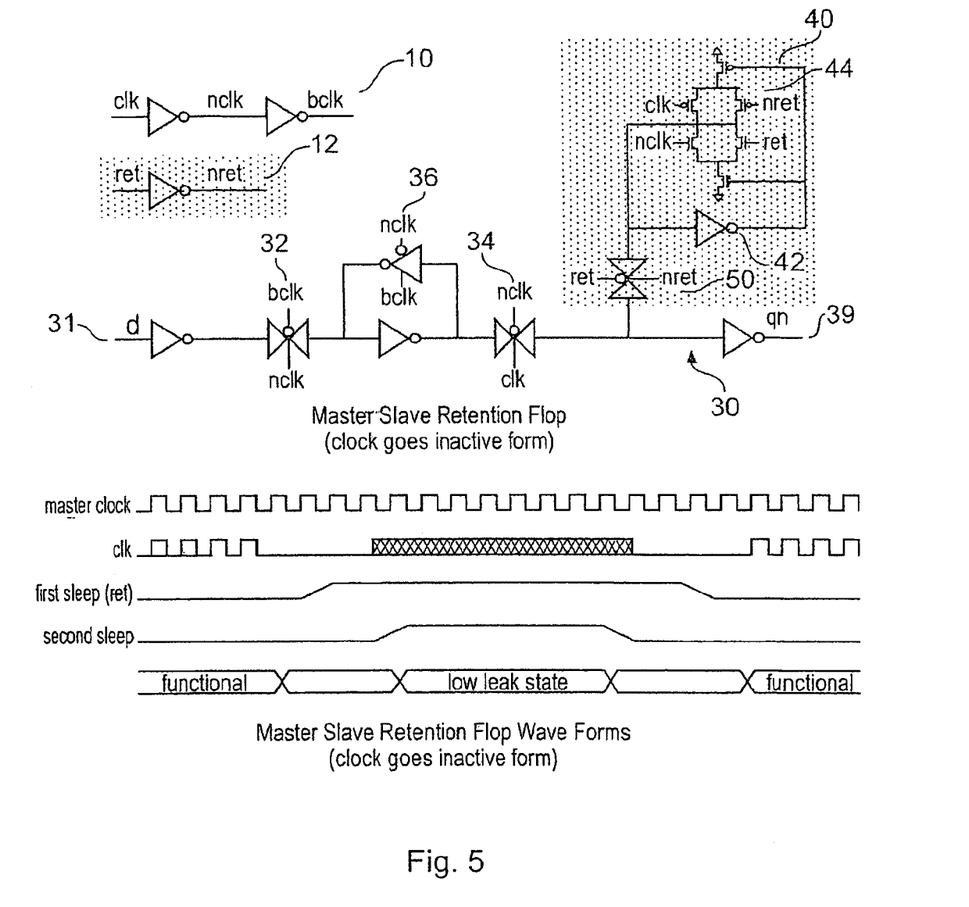
FIG. 5 schematically shows a master slave retention flip flop according to the second embodiment of the present invention and a timing diagram of its operation.

FIG. 5 shows the master slave retention form of the second embodiment comprising the tristate inverter 44 of FIG. 4. This diagram also shows a timing diagram relating to the operation of the master slave retention flop 30 of this second embodiment. This timing diagram shows how in the low leakage or sleep state the value of the clock signal is unimportant and thus, clock distribution logic can be turned off. In this embodiment it is just sleep signal distribution logic 12, slave latch 40 and transmission gate 50 which are powered up in sleep mode. This embodiment therefore allows a significant power saving at a cost in area of just two transistors compared to the embodiment of FIG. 2. This embodiment has an additional six transistors compared to the prior art master slave flop of FIG. 1 which had no retention capabilities.

Figure 6:
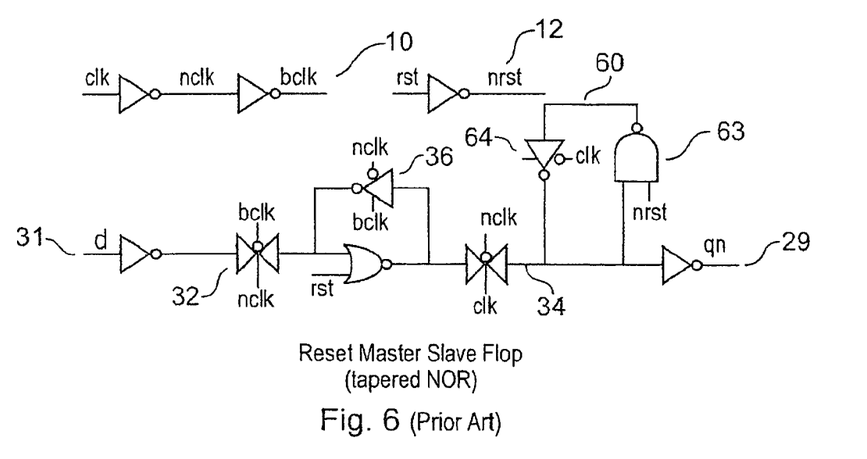
FIG. 6 schematically shows a reset master slave flip flop according to the prior art.

FIG. 6 shows a reset master slave flop according to the prior art. Data retention during sleep mode can be particularly difficult if the retention latch is a latch within a set or reset flip flop. This is because when powering up great care must be taken that the latch storing the data is not set or reset before that data has been extracted, otherwise, the data could be lost on power up and its retention will then have been worthless. As can be seen from FIG. 6, the slave latch 60 comprises a NAND gate 63 in parallel with tristate inverter 64.

Figure 7:
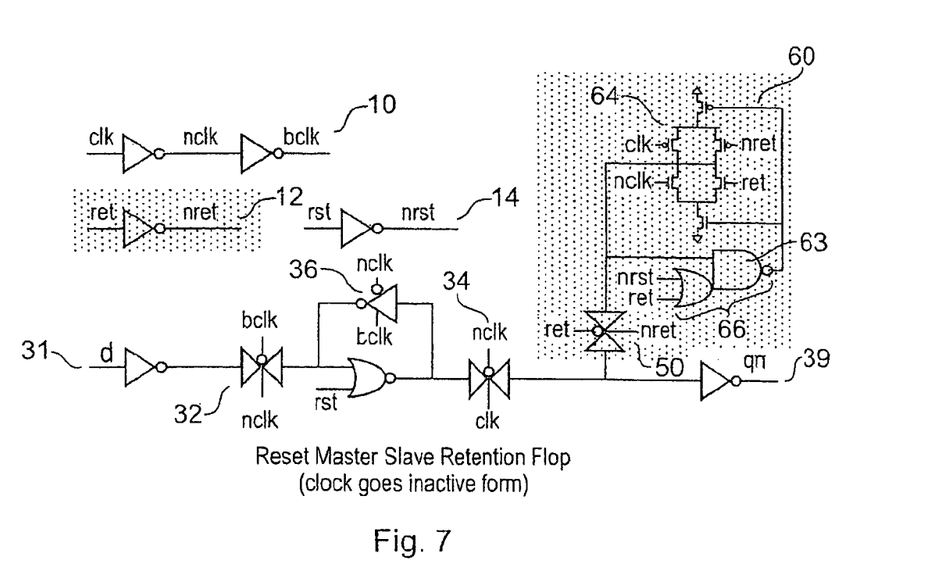
FIG. 7 schematically shows a reset master slave retention flip flop according to an embodiment of the present invention and a timing diagram of its operation.

FIG. 7 shows a reset master slave retention flop according to an embodiment of the present invention. In this embodiment, slave or retention latch 60 comprises tristate inverter 64 adapted to retain state even when the clock signal is turned off, in a similar way to the retention latch shown in FIG. 5. Thus, clock distribution logic 10 does not have to be powered up during sleep mode. It should be clear to the skilled person that slave latch 60 could comprise a standard tristate inverter such as that shown in FIG. 2, in which case the clock distribution logic would need to retain power during sleep mode. In addition to clock signal distribution logic 10 and sleep signal distribution logic 12 there is reset distribution logic 14 that is operable to distribute a reset signal rst, and an inverted reset signal, nrst, to appropriate parts of the circuit. In addition to NAND gate 63 equivalent to NAND gate 63 of FIG. 6 there is additional logic 66 on the reset signal input to this NAND gate. This logic 66 ORs the inverted reset signal nrst with the sleep signal ret and thereby assures that the retention latch 60 is not accidentally reset either on entry into or exit from sleep mode.

Figure 8:
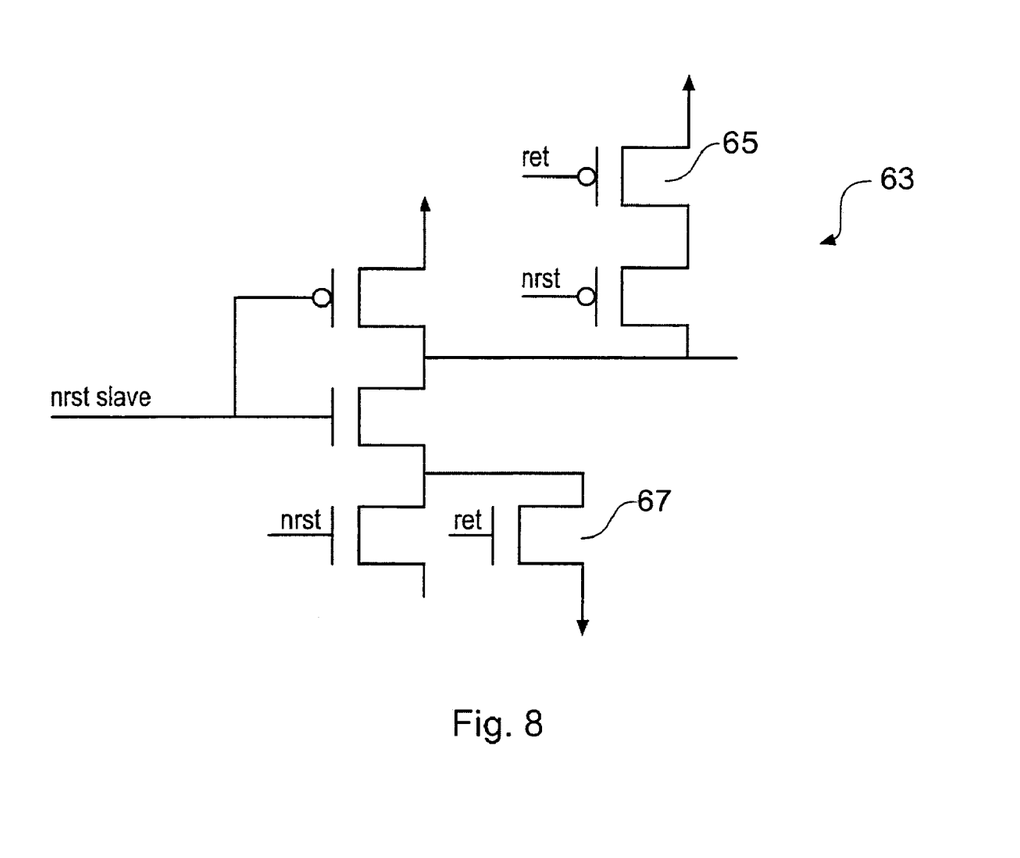
FIG. 8 shows the component transistors of an amended tristate inverter of the slave latch of the reset master slave retention flip flop of FIG. 7.

FIG. 8 shows gate 66 in transistor form. Specifically, the addition of two sleep transistors 65 and 67 which have the ret signal on their inputs and thereby impede the reset signal from going high during sleep mode transform NAND gate 63 to OAI12 66.

Figure 9A:
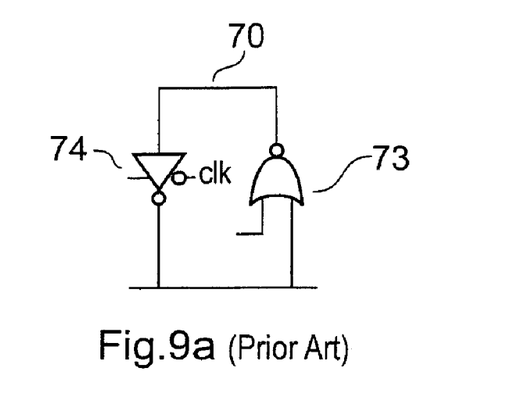
FIG. 9a shows the slave latch of a set master slave flop according to the prior art.
Figure 9B:
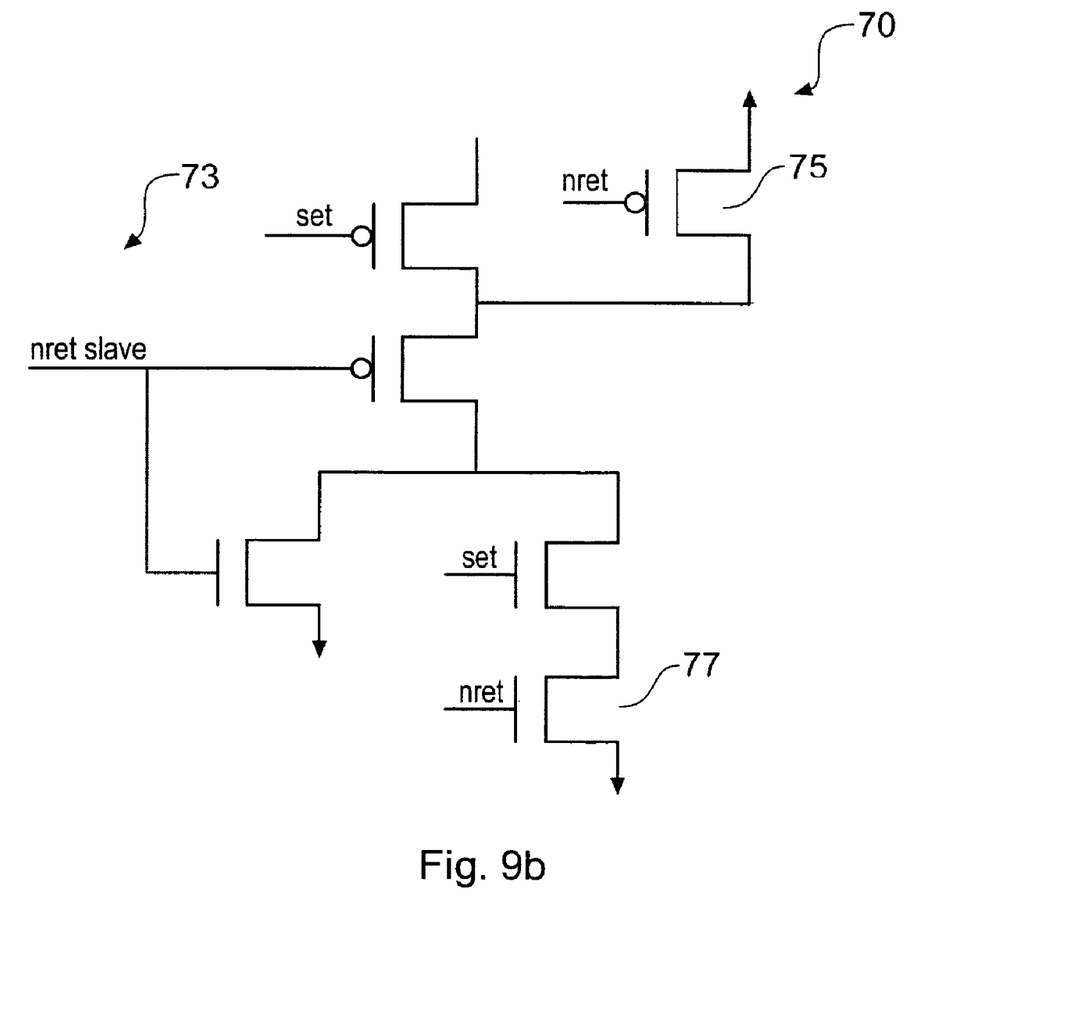
FIG. 9b shows the slave latch of a set retention master slave flop according to an embodiment of the present invention.

FIG. 9 shows a corresponding embodiment for a set flop. FIG. 9a shows the slave latch 70 of a conventional set flop. In this set flop, a NOR gate 73 is placed in parallel with the tristate inverter 74 of slave latch 70. Slave latch 70 corresponds to slave latch 60 of the reset flop of FIG. 6, for a set flop. FIG. 9b shows how an addition of two nret FETs 75 and 77 can transform NOR gate 73 to an AOI12 gate 70. These additional transistors 75 and 77 act like the transistors 65 and 67 of the reset flop to impede the set signal from being asserted during sleep mode.

Figure 10:
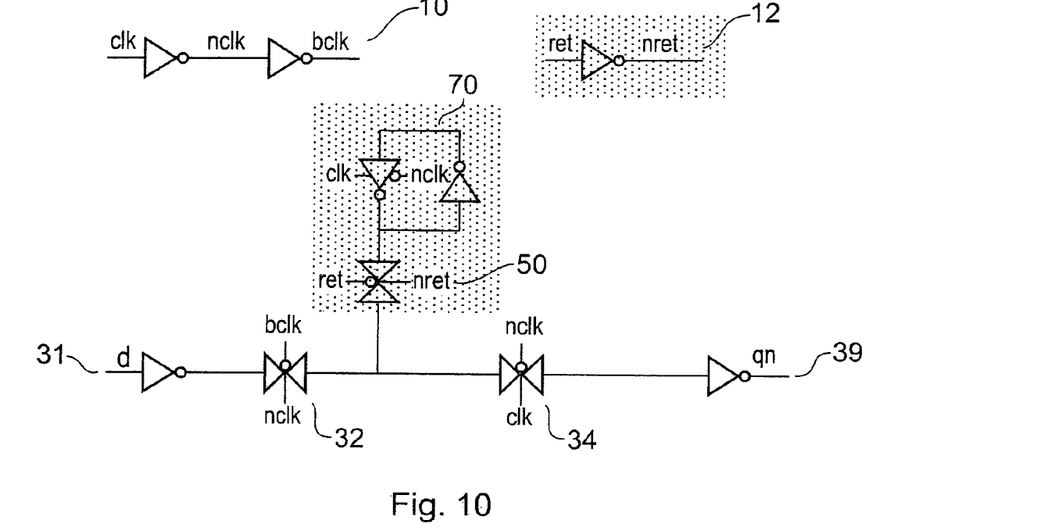
FIG. 10 shows a single retention latch according to an embodiment of the present invention.

FIG. 10 shows an embodiment of the present invention comprising a single retention latch 70 that is not clocked. It should be noted that although a tristate inverter is advantageous within the latch as it allows for the state of the latch to be easily switched, it is not essential and an unclocked latch comprising inverters arranged in a loop such as that shown as 70 in FIG. 10 is possible. In this embodiment the retention latch 70 and sleep signal distribution logic 12 retain power during sleep mode. The clock distribution logic, however, does not retain power in this embodiment.

Figure 11:
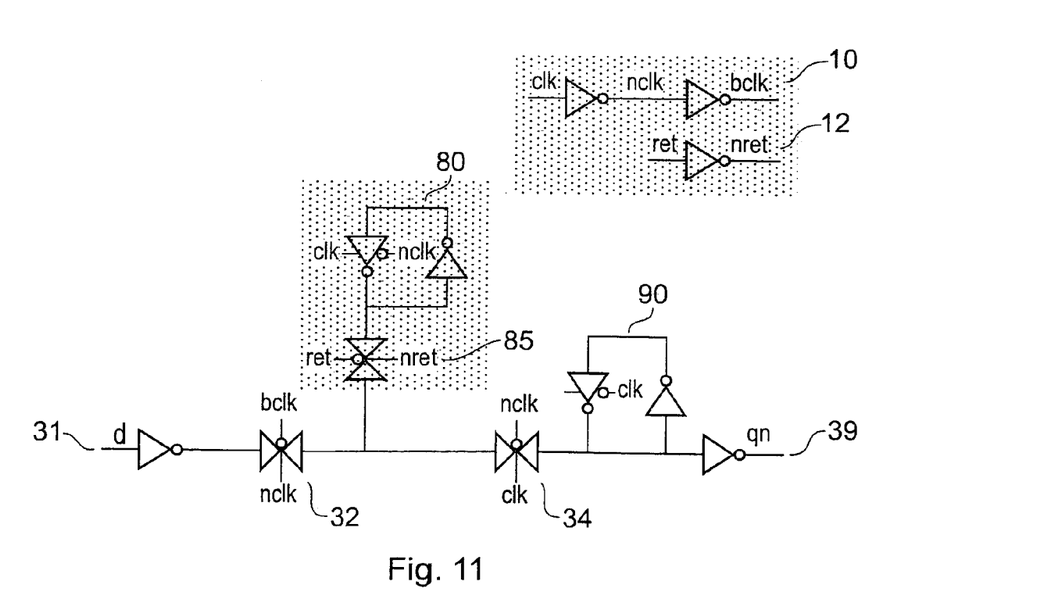
FIG. 11 shows a master slave flop, wherein the retention latch comprises the master latch.

FIG. 11 shows an alternative embodiment where retention latch 80 comprises the master latch of a master/slave flop. This embodiment corresponds to the clocked embodiment of FIG. 2 and clock distribution logic 10, sleep signal distribution logic 12 and retention latch 80 retain power during sleep mode.

It should be noted that all flops are shown as having inverters on the forward data path, but it should be clear to the skilled person that they could equally well be built with non-inverters in which case an additional inverter would be needed at the end of the forward data path 33. It should be clear to a skilled person that such alternative embodiments fall within this scope of the present invention as defined in the appended claims.

One purpose of the inverters on the forward data path is to decouple the inputs and outputs and in the case of the inverter 37 at the output to provide an output with acceptable driving capabilities. One potential problem with output inverter 37 of FIG. 2, becomes clear when referring to the timing diagram of this Figure. When the pdn (second sleep) signal goes low, i.e. power is turned back on to the sleeping portion of the circuit, the inverter 37 is powered up but nothing is driving its input. The transmission gate 34 could drive it but clk is low so that transmission gate 34 is off. The transmission gate 50 could drive it but ret is low so that transmission gate 50 is off. If the input of inverter 37 does not have a voltage close to either power or ground then both the pmos and nmos in the inverter could be on which would result in a large current through the inverter. This is not a good idea in a design whose aim is to reduce power consumption. The embodiment of FIG. 12 has been designed to address this problem.

Figure 12:
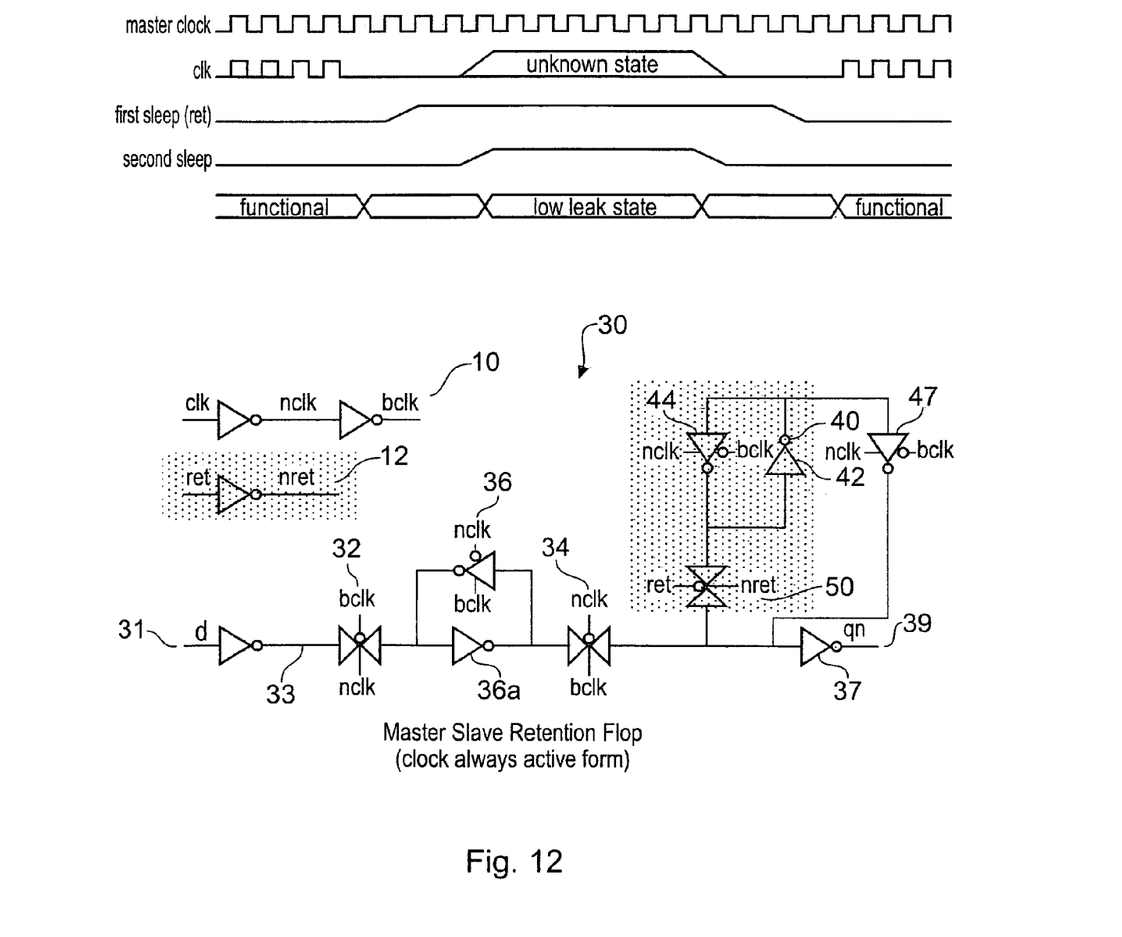
FIG. 12 schematically shows a master slave retention flip flop according to an embodiment of the present invention and a timing diagram of its operation.

FIG. 12 is similar to FIG. 2, but has additionally a tristate inverter 47 connecting the top of the retention latch to output inverter 37. Tristate inverter 47 is powered by the gated power supply, which is the power supply that is powered down. It is important that this tristate inverter is powered by the gated power supply, so that in power down mode there is no sneak leakage path through the transmission gate 34 and through the inverter 36a to the powered down supply. What this additional tristate inverter does is drive gate 37 when clk is low which guarantees that when gate 37 is powered up it is always driven by something. So, the potential problem with the embodiment of FIG. 2 is addressed. Furthermore, this design has the additional advantage that the output 39 gets the retained state after second sleep goes low and clk goes low, but before first sleep goes low. In the embodiment of FIG. 2 the output 39 does not get the retained state until after first sleep goes low. This is explained below.

In order to retain the state of the flip flop the user must assert the retain signal RET (first sleep signal) before powering down and entering sleep mode. Asserting RET prevents the retention latch 40 from being written to. This preserves the state it was in regardless of changes on the clock or data pins. When sleep mode is entered the state of the master latch 36 is lost. The state of the retention latch is preserved as it is powered by the always on power supply and RET being asserted prevents garbage from being written into it.

On exiting sleep mode, the rest of the flop is powered up. While powering up the retention latch will be immune to glitches on the clock and data pins provided RET remains constantly asserted and the gated power supply powers up. If the clock pin is held low while powering up as is the case in this embodiment, the retention latch will be writing the retained state into the slave node which is the input to inverter 37 as it powers up. In a multi latch environment this will be happening simultaneously in all the retention flops in the block that is being powered up and the block will thus, power up with its state restored.

In some embodiments the clock may not be held low during power up. In such cases the state will be restored as soon as the clock goes low following power up. In this regard it should be noted that the embodiment of FIG. 12 also differs from FIG. 2 in that the clock circuit 10 is not powered by the always on power supply. Thus, when powered down the clock circuit outputs an unknown state as is shown in the timing diagram. Clk goes low when first sleep goes low, it doesn't have to immediately go low, it can have glitches while the system is powering up, but we require that first sleep remain high until clk is low and not glitching any more. The state will be restored when second sleep and clk are both low. Once the state is restored, then first sleep can go low and normal clocking can resume.

It should be noted that in the embodiments described above, it is inverter 37 that is driven to avoid potential power loss on start up after sleep mode. In other embodiments there may not be an inverter at the output, there may be a different device. A potential power loss problem could occur with a variety of devices, and a solution would be to provide a driving signal, using, for example the tristate inverter 47 of FIGS. 12 and 13.

One further point is that a further difference between FIG. 2 and FIG. 12, is that some devices, in particular tristate inverters 44 and 47 and transmission gate 34 are connected to nclk and bclk rather than clk and nclk. Either connections work, the use of bclk rather than clk helps reduce the capacitance on the clk pin, while the use of clk gets a faster clock to q response.

Figure 13:
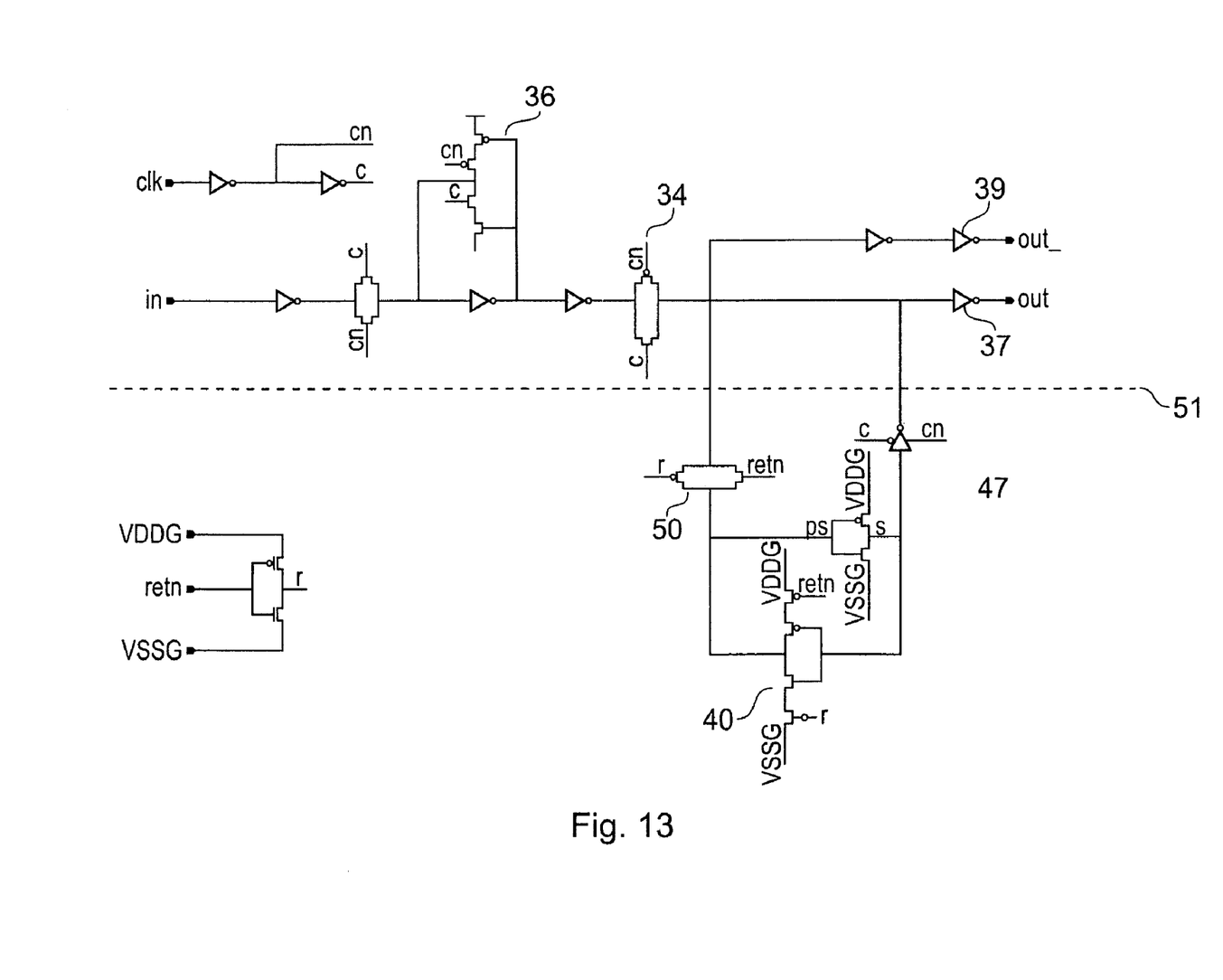
FIG. 13 schematically shows the master slave retention flip flop of FIG. 12 in transistor form.

FIG. 13 shows the embodiment of FIG. 12 in transistor form. It is clear from this diagram that the retention flop can be formed from a conventional flop with the provision of just three additional pins. These pins are VDDG and VSSG pins, the gated power supply, and the retn or first sleep signal. It should be noted that alternative embodiments could just have one of VDDG or VSSG, as both are not required, if only one is used then the other is shorted to the standard power supply VDD or VSS. All devices below dotted line 51 are HVT devices.

Figure 14:
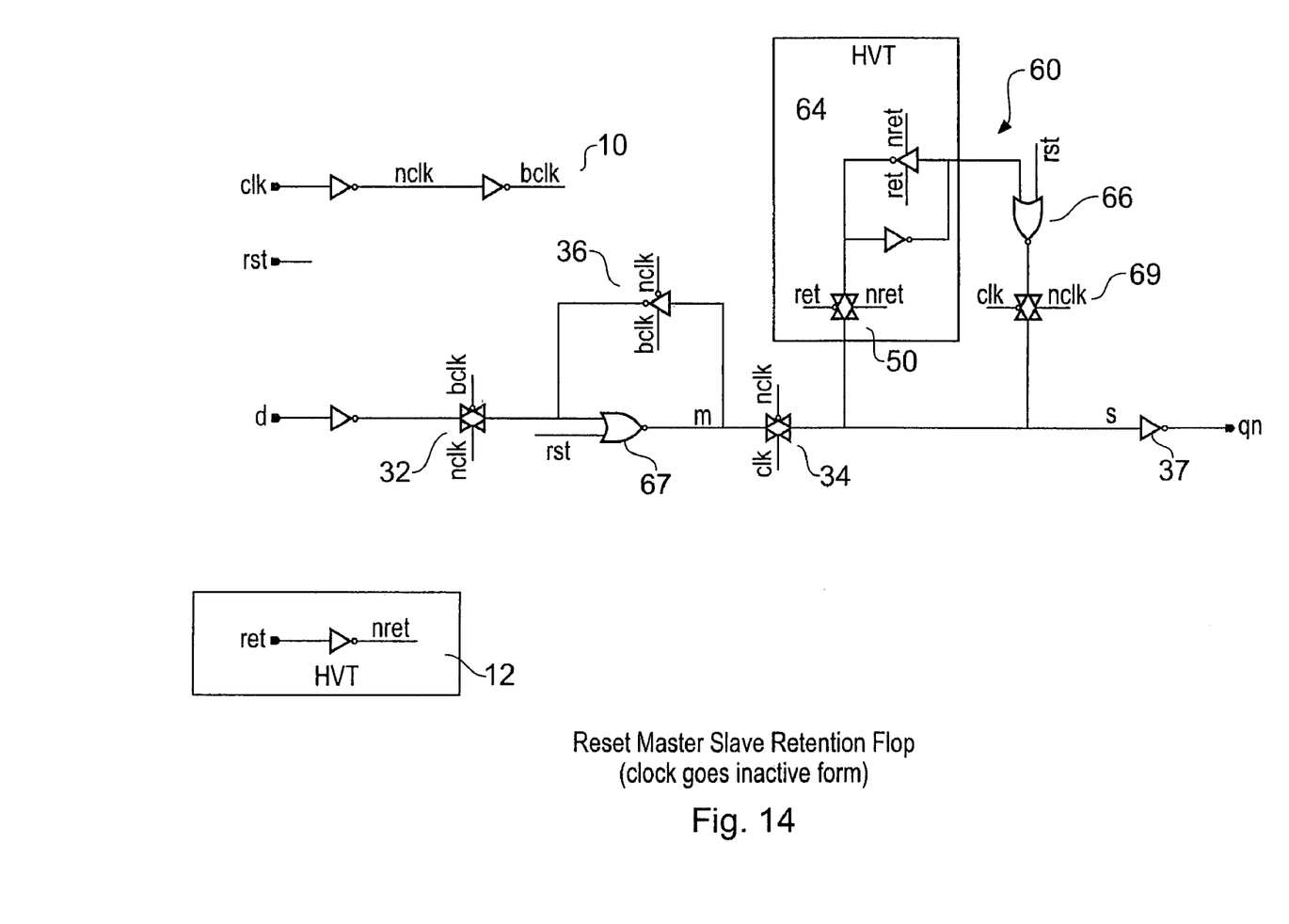
FIG. 14 shows the master slave retention flip flop of FIGS. 12 and 13 adapted to receive a rest signal.

FIG. 14 shows the embodiment of FIGS. 12 and 13, adapted to receive a reset signal. It is in effect a version of the embodiment of FIG. 7 modified to address the problem of a floating input to an output gate, in this case inverter 37, which can potentially have significant power loss implications. In this diagram all devices that are HVT devices are powered by the power supply that is always on, while the others are powered by the gated power supply and are thus, not powered during sleep mode. This embodiment differs from the embodiment of FIG. 7 essentially in the provision of nor gate 66 and transmission gate 69 placed between the retention latch and the input to inverter 37. This transmission gate 69 has an opposite connection to clk to the transmission gate 34. Thus, when clk is low device 69 is on and 34 is off. When clk is high device 34 is on and 69 is off. Either way, something is driving gate 37. When pdn (second sleep) is high then clk is unknown and both device 34 and 69 are in unknown states and possibly nothing is driving gate 37. However, when pdn is high gate 37 is powered down and it is okay for the input to gate 37 to be unknown. As soon as pdn goes low, clk goes to either one or zero and something drives gate 37.

This embodiment also has transmission gate 50 which can isolate the retention latch 60. The only way to change the state of this retention latch is via device 50. In retention mode, when the retention (or first sleep signal) is asserted device 50 is off so that the latch is isolated and cannot be reset. In normal operating mode, depending on the state of the clock, the reset would propagate through one of the nor gates 66 or 67 and a respective one of the transmission gates 69 or 34 and through device 50 to reset the retention latch. In retention mode, a glitch on reset can propagate through the nor gates to node S and to the output qn but when the glitch goes away the data is still saved in the retention latch and can be read out through devices 66 and 69.

One further point to note about the embodiments described above is that the bulk node of any devices that are powered on in sleep mode, have to be connected to the always on power or ground and not to the gated supply. Further the bulk nodes of transmission gate 50 are connected to the always on power supply. In preferred embodiments the bulk nodes of every device are connected to the always on power and ground.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A circuit for retaining a signal value during a sleep mode while a portion of said circuit is powered down comprising:
    a clock signal input configured to receive a clock signal;
    at least one latch clocked by said clock signal;
    a data input, a data output and a forward data path therebetween, wherein a signal value is received at said data input, is clocked into said at least one latch and passes to said data output along said forward data path; wherein
    at least one of said at least one latch comprises a retention latch configured to retain a signal value during said sleep mode, and said circuit further comprises
    a tristateable device, arranged between said forward data path and said retention latch, configured to selectively isolate said retention latch from said forward data path in response to receipt of a first sleep signal; wherein
    said circuit is responsive to receipt of a second sleep signal received after said first sleep signal and configured to enter said sleep mode such that said portion of said circuit is powered down by reducing a voltage difference across said portion of said circuit, and a voltage difference across said retention latch and said tristateable device is maintained;
    said circuit further comprising an output device between said retention latch and said data output, and a driving device in data communication with an input of said output device; wherein
    said output device and said driving device are configured to enter said sleep mode on receipt of said second sleep signal; and
    said driving device is configured to drive an input of said output device in response to said second sleep signal not being asserted.

2. A circuit according to claim 1, comprising a plurality of latches clocked by said clock signal, said signal value passing from one of said plurality of latches to a subsequent one of said plurality of latches along said forward data path, at least one of said plurality of latches comprising said retention latch.

3. A circuit according to claim 1, wherein said tristateable device comprises a bidirectional tristateable device.

4. A circuit according to claim 3, wherein said bidirectional tristateable device comprises two transistors configured to receive said first sleep signal and arranged such that, in response to receipt of said first sleep signal, said two transistors form a high impedance path and, in response to not receiving said first sleep signal, said two transistors form a low impedance path.

5. A circuit according to claim 1, wherein said tristateable device comprises four transistors, two of said four transistors forming said tristateable device and two of said four transistors forming an inverter configured to invert said first sleep signal prior to inputting it to one of said two transistors.

6. A circuit according to claim 5, wherein said tristateable device comprises a transmission gate.

7. A circuit according to claim 1, wherein said retention latch is configured to receive said clock signal.

8. A circuit according to claim 7, said circuit further comprising:
    clock signal distribution means for distributing said clock signal to said retention latch.

9. A circuit according to claim 8, said clock signal distribution means, in response to said first sleep signal, is configured to hold said clock signal at a predetermined value such that said retention latch retains state.

10. A circuit according to claim 8, wherein said clock signal distribution means comprises a logic gate having a clock signal input and a first sleep signal input.

11. A circuit according to claim 9, wherein said clock signal distribution means comprises a plurality of components through which said clock signal propagates, said circuit is configured to reduce a voltage difference across said components of said clock signal distribution means upstream in a clock signal propagation direction of said first sleep signal input such that said components are powered down in response to said first sleep signal, and to maintain a voltage difference across said components downstream of said first sleep signal input.

12. A circuit according to claim 7, wherein said retention latch comprises a clocked tristate inverter, and transistors arranged in parallel with a portion of said clocked tristate inverter and configured to receive said first sleep signal such said retention latch is operable to retain state irrespective of a value of said clock during receipt of said first sleep signal.

13. A circuit according to claim 12, wherein said transistors comprise two transistors in parallel with said two clocked transistors of said tristate inverter, said two transistors receiving said first sleep signal and an inverted first sleep signal respectively.

14. A circuit according to claim 1, said circuit comprising at least one further latch, at least two of said latches comprising a master slave flip flop comprising a master latch and a slave latch, said retention latch comprising said slave latch.

15. A circuit according to claim 14, wherein said master slave flip flop comprises a reset master slave flip flop, said retention latch comprising two transistors configured to receive said first sleep signal and a reset signal and configured to block said reset signal and prevent it from resetting a state of said retention latch in response to receipt of said first sleep signal.

16. A circuit according to claim 14, wherein said master slave flip flop comprises a set master slave flip flop, said retention latch comprising two transistors configured to receive said first sleep signal and a set signal and configured to block said set signal and prevent it from setting a state of said retention latch in response to receipt of said first sleep signal.

17. A circuit according to claim 1, said circuit further comprising a voltage regulator configured to control a voltage level supplied to portions of said circuit, said voltage regulator configured to receive said second sleep signal and, in response to said second sleep signal, to reduce a voltage difference across said portion of said circuit such that said portion of said circuit is powered down and to maintain a voltage difference across said retention latch and said tristateable device.

18. A circuit according to claim 1, said circuit powered in response to a voltage difference applied across said circuit, said circuit further comprising a power transistor, said power transistor arranged such that said voltage difference is applied across said power transistor and said portion of said circuit in series, said power transistor configured to receive said second sleep signal and to turn off in response to said second sleep signal, such that a voltage difference across said portion of said circuit is reduced and said portion of said circuit is powered down in response to said second sleep signal.

19. A circuit according to claim 1, wherein said retention latch and said tristateable device comprise low leakage devices.

20. A circuit according to claim 1, comprising a plurality of retention latches.

21. A circuit according to claim 1, wherein said retention latch comprises a circulating loop and said driving device is a tristate inverter having an input in data communication with a portion of said circulating loop remote from an output of said loop.

22. A circuit according to claim 21, said circuit further comprising clock signal distribution means for distributing said clock signal to said retention latch and said tristate inverter, said clock signal distribution means comprising a first sleep signal input responsive to said first sleep signal and a second sleep signal input responsive to said second sleep signal, said clock distribution means configured to output a signal at a predetermined level in response to said first sleep signal being asserted in conjunction with said second sleep signal not being asserted, to be powered down in response to both said first sleep signal and said second sleep signal being asserted, and to output said clock signal in response to neither of said first or second sleep signals being asserted; wherein
said tristate inverter, in response to said clock being at said predetermined level and said second sleep signal not being asserted, is configured to drive said output device.

23. A circuit according to claim 1, wherein said driving device comprises second tristateable device, said second tristateable device, being oppositely clocked to said first tristateable device such that one of said tristateable devices is configured to drive said output device in response to a clock signal received by one of said tristateable devices having a predetermined level.

24. A circuit according to claim 23, said circuit comprising at least one further latch, at least two of said latches comprising a reset master slave flip flop, comprising a master latch a slave latch, and two reset inputs, each of said two reset inputs being in data communication with said retention latch via respective one of said two oppositely clocked tristateable devices, said retention latch comprising said slave latch, wherein said retention latch comprises a circulating loop and a third tristateable device, said third tristateable device, responsive to said first sleep signal being asserted, configured to isolate said circulating loop from said reset inputs.

25. A method of storing a signal value within a circuit during a sleep mode while a portion of said circuit is powered down, said method comprising the steps of:
distributing a clock signal to a clock input of at least one latch, said at least one latch located between a data input and a data output such that a signal value received at said data input, is clocked into said at least one latch and passes to said data output along a forward data path, and at least one of said at least one latch is a retention latch configured to retain a signal value during said sleep mode; wherein
in response to a first sleep signal, isolating said retention latch from said forward data path using a tristateable device located between said forward data path and said retention latch; and, in response to a second sleep signal, reducing a voltage difference across said portion of said circuit such that said portion of said circuit is powered down; and maintaining a voltage difference across said retention latch and said tristateable device; and
powering down an output device and a driving device of said output device wherein said driving device drives an input of the output device when said second sleep signal is not asserted.

26. A circuit for retaining a signal value while a portion of said circuit is powered down comprising:
a clock signal input configured to receive a clock signal;
a means for retaining data clocked by said clock signal, said retaining means comprising a forward data path such that a signal value passes from a data input, is clocked into a retention means and passes to a data output along said forward data path and, said retention means being configured to retain a signal value during a sleep mode; and
a tristateable means for selectively isolating said retention means from said forward data path in response to receipt of a first sleep signal, said tristateable means arranged between said forward data path and said retention means; wherein
said circuit, in response to a second sleep signal received after said first sleep signal, is configured to enter said sleep mode such that a portion of said circuit is powered down by reducing a voltage difference across said portion of said circuit, and a voltage difference across said retention means and said tristateable means is maintained;
said circuit further comprising an output device between said retention latch and said output, and a driving device in data communication with an input of said output device; wherein
said output device and said driving device are configured to enter said sleep mode on receipt of said second sleep signal; and
said driving device is configured to drive an input of said output device in response to said second sleep signal not being asserted.

* * * * *